United States Patent
Lee et al.

(10) Patent No.: US 7,419,855 B1
(45) Date of Patent: Sep. 2, 2008

(54) APPARATUS AND METHOD FOR MINIATURE SEMICONDUCTOR PACKAGES

(75) Inventors: Shaw Wei Lee, Cupertino, CA (US); Nghia Thuc Tu, San Jose, CA (US); Santhiran S/O Nadarajah, Melaka (MY); Lim Peng Soon, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 48 days.

(21) Appl. No.: 11/607,141

(22) Filed: Dec. 1, 2006

Related U.S. Application Data

(62) Division of application No. 10/942,061, filed on Sep. 14, 2004, now Pat. No. 7,161,232.

(51) Int. Cl.
*H01L 21/00* (2006.01)

(52) U.S. Cl. .................. 438/118; 438/119; 438/628; 438/FOR. 340; 257/E23.127; 257/676; 257/783

(58) Field of Classification Search .......... 257/E25.023, 257/E25.031, E23.046, E23.124, E23.031, 257/678, 668, 684, E23.039, 676, 669, 783, 257/E23.127; 437/180; 438/118, 119, 628, 438/644, 654, FOR. 340
See application file for complete search history.

(56) References Cited

U.S. PATENT DOCUMENTS

| | | | |
|---|---|---|---|
| 4,480,013 A | 10/1984 | Doi et al. ................ 428/616 |
| 4,550,333 A | 10/1985 | Ridder et al. ............. 357/81 |
| 5,175,060 A | 12/1992 | Enomoto et al. ........... 428/620 |
| 5,304,843 A | 4/1994 | Takubo et al. ............. 257/670 |
| 5,471,088 A * | 11/1995 | Song ...................... 257/668 |
| 5,614,316 A | 3/1997 | Hashimoto et al. ......... 428/344 |
| 5,818,105 A | 10/1998 | Kouda .................... 257/696 |
| 5,859,471 A | 1/1999 | Kuraishi et al. ........... 257/666 |
| 5,866,939 A * | 2/1999 | Shin et al. ................ 257/666 |
| 6,060,768 A * | 5/2000 | Hayashida et al. ......... 257/666 |
| 6,132,865 A | 10/2000 | Oka et al. ................ 428/344 |
| 6,201,292 B1 * | 3/2001 | Yagi et al. ............... 257/666 |
| 6,265,782 B1 | 7/2001 | Yamamoto et al. ......... 257/783 |
| 6,281,568 B1 | 8/2001 | Glenn et al. .............. 257/684 |
| 6,294,100 B1 | 9/2001 | Fan et al. ................ 216/14 |

(Continued)

FOREIGN PATENT DOCUMENTS

JP 09283661 10/1997

(Continued)

OTHER PUBLICATIONS

National Semiconductor Corporation, "*Leadless Leadframe Package (LLP)*" AN-1187, Mar. 2004, 21 pages.

*Primary Examiner*—Chris C. Chu
(74) *Attorney, Agent, or Firm*—Beyer Law Group LLP

(57) ABSTRACT

A method and apparatus for making reliable miniature semiconductor packages having a reduced height and footprint is provided. The package includes a semiconductor chip having an active surface and a non-active surface and one or more contacts positioned adjacent the semiconductor chip. Electrical connections are formed between the contacts and the semiconductor chip. An adhesive tape provided adjacent the non-active surface of the semiconductor chip and the one or more contacts positioned adjacent the semiconductor chip. An adhesive material provided between the non-active surface of the chip and the adhesive tape.

18 Claims, 6 Drawing Sheets

U.S. PATENT DOCUMENTS

| | | | |
|---|---|---|---|
| 6,300,673 B1 | 10/2001 | Hoffman et al. | 257/666 |
| 6,429,508 B1 | 8/2002 | Gang | 257/678 |
| 6,673,441 B1 | 1/2004 | Tanaka et al. | 428/355 |
| 7,161,232 B1 * | 1/2007 | Lee et al. | 257/676 |

FOREIGN PATENT DOCUMENTS

| | | |
|---|---|---|
| JP | 11260972 | 9/1999 |
| JP | 2002184801 | 6/2002 |

* cited by examiner

APPARATUS AND METHOD FOR MINIATURE SEMICONDUCTOR PACKAGES

CROSS REFERENCE TO RELATED APPLICATIONS

This application is a Divisional of U.S. patent application Ser. No. 10/942,061 entitled "Apparatus and Method for Miniature Semiconductor Packages" filed on Sep. 14, 2004 now U.S. Pat. No. 7,161,232 which is incorporated herein by reference.

FIELD OF THE INVENTION

The present application relates to semiconductor packaging, and more particularly, to making reliable miniature semiconductor packages with a reduced height and footprint.

BACKGROUND OF THE INVENTION

Consumers of many electronic devices, such as cell phones, personal digital assistants, and other mobile communication and/or computation devices, desire smaller devices with more and more functionality. As a result, semiconductor engineers are challenged with not only with cramming more chips into an enclosure, but also making the packages of individual chips smaller and smaller. One type of relatively small chip package, known in the industry as Leadless Leadframe Package (LLP), has been developed.

A leadless leadframe typically includes a plurality of die attach pads (PADs) arranged on the leadframe. A plurality of contacts are positioned around each PAD. The PADs and the contacts are held together by tie-bars. An adhesive tape is placed on the bottom of the leadframe, under the PADs and contacts. During the packaging process, a semiconductor chip is placed on each PAD using an adhesive or solder. Wire bonds are then formed between the chip and the contacts surrounding each chip. After wire bonding, the entire leadframe including the individual chips and wire bonds are encapsulated in a molding compound. The adhesive tape on the bottom of the leadframe is next removed, exposing the bottom surface of the PADs and the surrounding contacts. The leadframe is finally cut along the tie-bars, singulating the individual chip packages. The package is typically mounted by aligning the contacts of the package and soldering the bottom surface of the PAD to matching contacts on a printed circuit board. For more information on LLPs, see National Semiconductor's Application Note 1187 entitled "Leadless Leadframe Package (LLP)", incorporated by reference herein for all purposes.

In spite of the fact that LLP packages do not have leads, the packages are still too large for many applications. As a consequence, packaging engineers are striving to make the packages thinner and to have a smaller footprint. One known approach to making the package smaller is to eliminate the PAD for each package. By doing so, the height of the package can be reduced. With this type of package, the chip is mounted onto the adhesive tape, wire bonded, and then encapsulated. The problem with this type of package is that the chip will often move relative to its surrounding contacts during encapsulation. This movement may cause the wire bonds to fail, resulting in low packaging yields. This type of package is therefore less than ideal.

An apparatus and method of making reliable miniature semiconductor packages having a reduced height and footprint is therefore needed.

SUMMARY OF THE INVENTION

To achieve the foregoing, and in accordance with the purpose of the present invention, a method and apparatus for making reliable miniature semiconductor packages having a reduced height and footprint is provided. The package includes a semiconductor chip having an active surface and a non-active surface and one or more contacts positioned adjacent the semiconductor chip. Electrical connections are formed between the contacts and the semiconductor chip. An adhesive tape provided adjacent the non-active surface of the semiconductor chip and the one or more contacts positioned adjacent the semiconductor chip. An adhesive material provided between the non-active surface of the chip and the adhesive tape.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
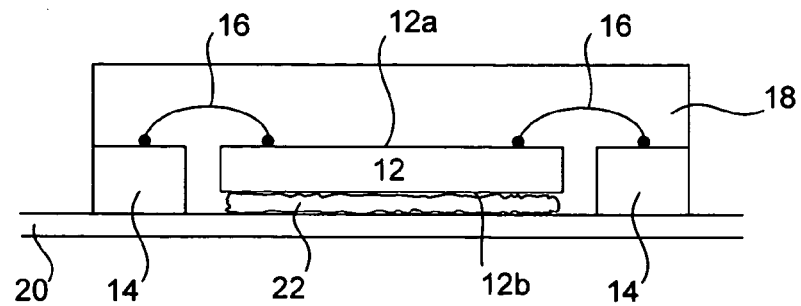
FIG. 1 is a cross section of a semiconductor package according to one embodiment of the present invention.

Referring to FIG. 1, a cross section of a semiconductor package according to one embodiment of the present invention is shown. The package 10 includes a semiconductor chip 12 having a top active surface 12a and a non-active bottom surface 12b. A plurality of contact leads 14 is provided surrounding the chip 12. Electrical connections 16, such as wire bonds, are provided between the leads 14 and I/O pads (not shown) on the active surface 12a of the chip 12. The chip 12, leads 14 and wire bonds 16 are encapsulated in an encapsulant material 18, such as epoxy. An adhesive tape 20 is provided on the bottom surface of the package 10. An adhesive material 22 is provided between the non-active surface 12b of the chip 12 and the tape 20. In various embodiments, the adhesive material 22 can be a non-conductive epoxy such as CRMX2154 from the Sumitomo Corporation of Japan or a conductive epoxy such as 8340 from Ablestik, which contains a silver resin. The adhesive material 22 is applied to either the tape 22 and/or the non-active surface 12b of the chip 12 prior to encapsulation. The adhesive material 22 and the adhesive surface of the tape 20 cooperate together to prevent the chip 12 from moving or becoming misaligned relative to the leads 14 during encapsulation.

Figure 2:
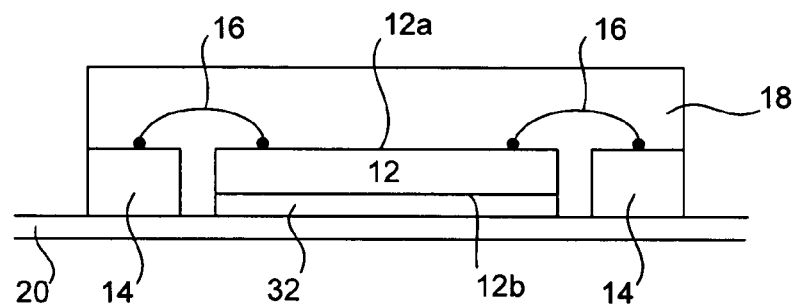
FIG. 2 is a cross section of another semiconductor package according to a second embodiment of the present invention.

Referring to FIG. 2, a cross section of another semiconductor package according to a second embodiment of the present invention is shown. The package 30 of FIG. 2 is similar to the package 10 as illustrated in FIG. 1. As such, like elements are designated with like reference numbers and are not described in detail herein. The difference between the two packages 10 and 30, however, is that the adhesive material 22 is replaced with a another type of adhesive material 32, such as a double sided adhesive die-attach film. As illustrated in FIG. 2, the adhesive material 32 is applied to the non-active surface 12b of the chip 12. Again, the double-sided adhesive material 32 and the adhesive surface of the tape 20 cooperate together to prevent the chip 12 from moving or becoming misaligned relative to the leads 14 during encapsulation.

Figure 3:
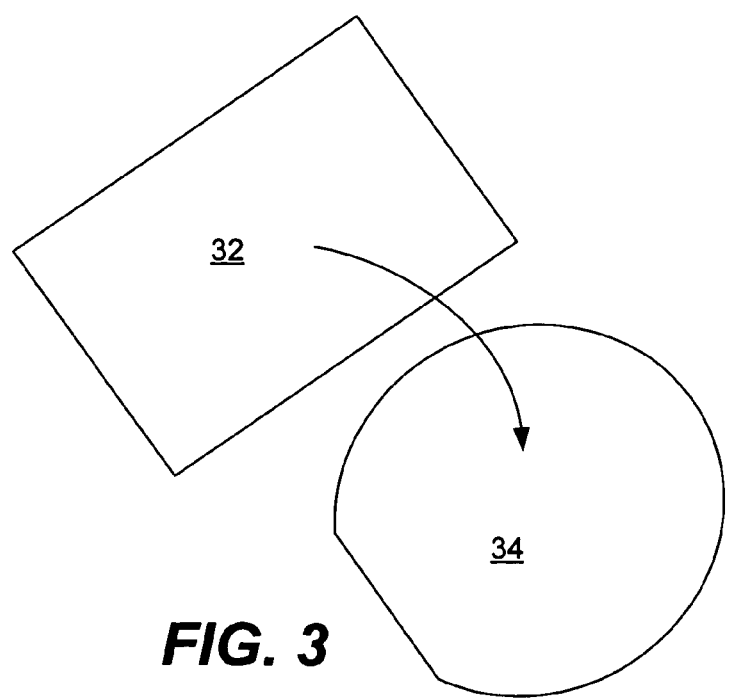
FIG. 3 is a perspective view of the application of an adhesive film onto a semiconductor wafer according to the present invention.

Referring to FIG. 3, a perspective view of the application of adhesive material 32 onto a semiconductor wafer according to one embodiment of the present invention is shown. In this embodiment, the adhesive material 32 or die-attach film is applied to the chip 12 when in wafer form. As illustrated, the back surface of a wafer 34 is shown face up. The active surface of the wafer 34, with the chips 12 fabricated thereon, is face down and is therefore not visible in this view. Each of the chips 12 is separated on the wafer by horizontal and vertical scribe lines (not visible). After fabrication of the wafer 34 is complete, a sheet of the adhesive material 32 is adhered to the back or non-active surface of the wafer 34. Thereafter, the wafer 34 is cut along the horizontal and vertical scribe lines in accordance with standard semiconductor fabrication techniques, resulting in the singulation of the individual chips 12. In this case, each chip 12 includes the adhesive material 32 formed on the non-active surface 12b of the chip 12 after singulation. In alternative embodiments, the adhesive material 32 can be applied individually to the non-active surface 12b of each chip 12.

Figure 4:
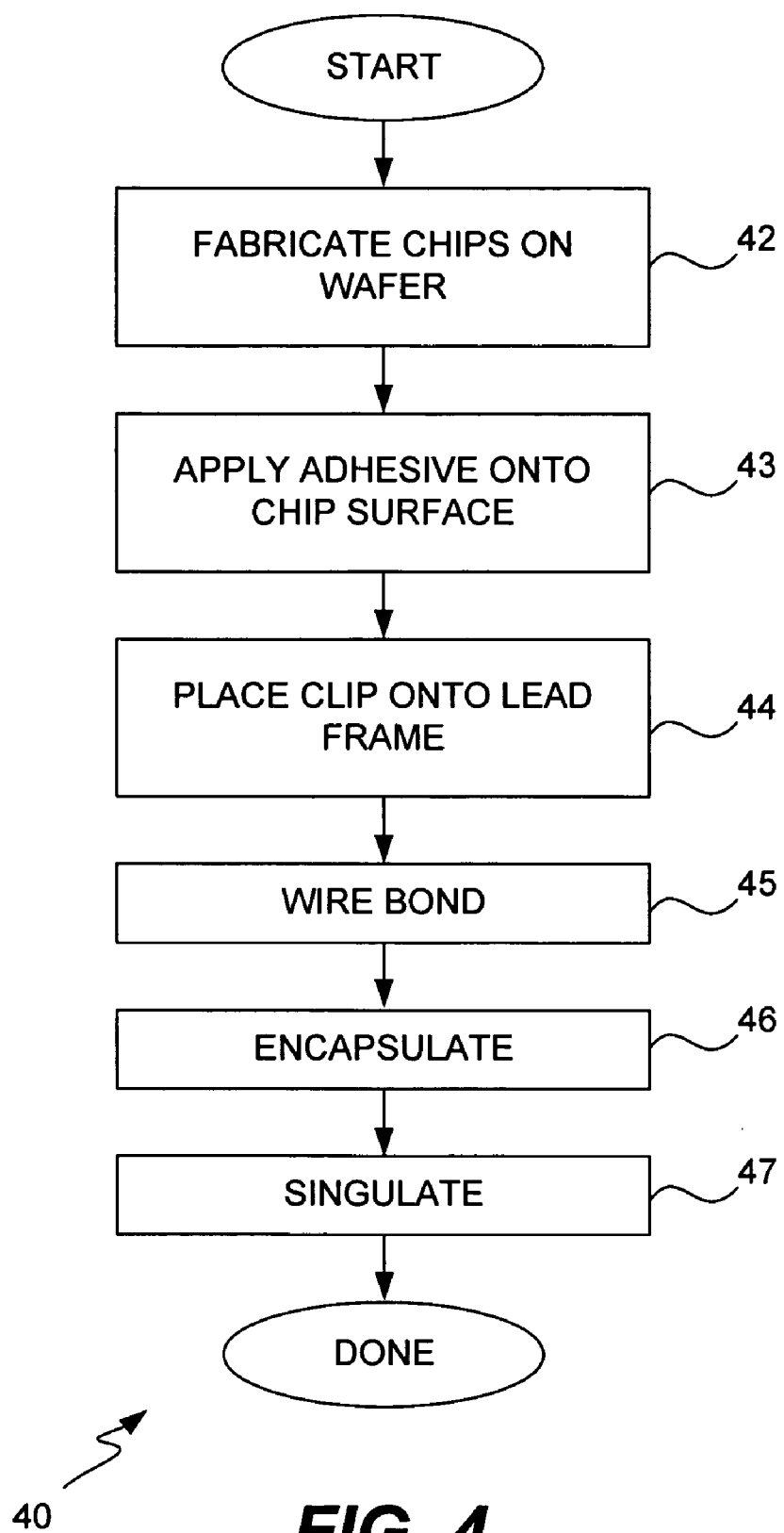
FIG. 4 is a flow chart illustrating the manufacturing steps of making the semiconductor chip package of the present invention according to one embodiment.

Referring to FIG. 4, a flow chart 40 illustrating the manufacturing steps for making the semiconductor chip package of the present invention according to one embodiment is shown. In the initial step, the individual chips 12 are fabricated on the wafer 34 in accordance with standard semiconductor processing techniques (box 42). The adhesive material 22 or 32 is next applied to the non-active surface 12b of the chips. As previously noted, an epoxy type adhesive material 22 can be applied to individual chips 12 after being signulated from the wafer 40. Alternatively, the epoxy can be applied to the adhesive tape 20 prior to placement of the chip 12 onto the tape. In yet another embodiment, the adhesive material such as the double stick die-attach film 32 can be applied to a wafer 40 and then singulated as discussed above (box 43) or applied individually to each chip 12. In the next step, the chip 12 is placed onto the tape 20 of the lead frame. As previously noted, the adhesive surface of the tape 20 and the adhesive material (either 22 or 32) cooperate together to securely hold the chip 12 in place (box 44). Thereafter, the chip 12 is wire bonded (box 45), and encapsulated (box 46). If more than one chip 12 is encapsulated on the lead frame, the chips are singulated (box 47) in the last step.

Figure 5:
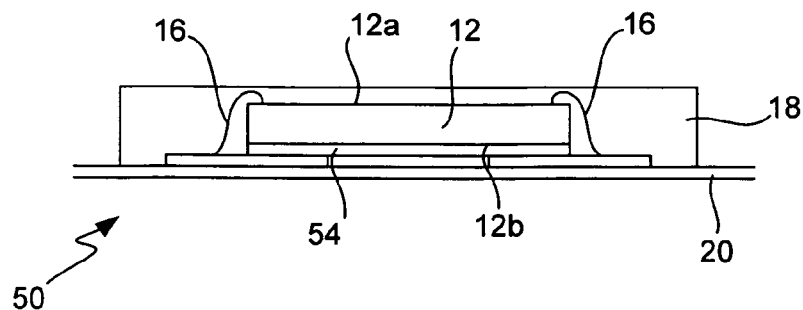
FIG. 5 is a cross section of another semiconductor package according to a third embodiment of the present invention.

FIG. 5 is a cross section of another semiconductor package according to a third embodiment of the present invention. This package 50, sometimes referred herein as a "chip on lead package", includes a chip 12 with its active surface 12a facing upward and the non-active surface 12b facing downward and a plurality of leads 52 spaced around the chip 12. The leads 52 are elongated compared to a standard lead on an LLP package and laterally extend into the space underneath the chip 12. As such, the chip 12 is resting on the leads 52 of the package 50. A non-conductive tape 54 is used to attach or secure the chip 12 to the leads 52. In various embodiments, the non-conductive tape 54 can be double-sided adhesive die attach film or a non-stick tape and an adhesive can be applied to both sides to secure the chip 12 to the leads 52. Electrical contacts 16 such as wire bonds are used to couple the I/O pads on the chip 12 to the leads 52. The package 50, including the chip 12, leads 52, contacts 16 and non-conductive tape 54, are encapsulated in an encapsulant 18. In an alternative embodiment, an additional non-conductive adhesive material, either an epoxy or a double-stick tape, can also be used in addition to the non-conductive tape 54 to secure the chip 12 to an adhesive tape 20. In yet another embodiment, the leads 52 are plated with PiNiAu to prevent copper migration.

Figure 6A:
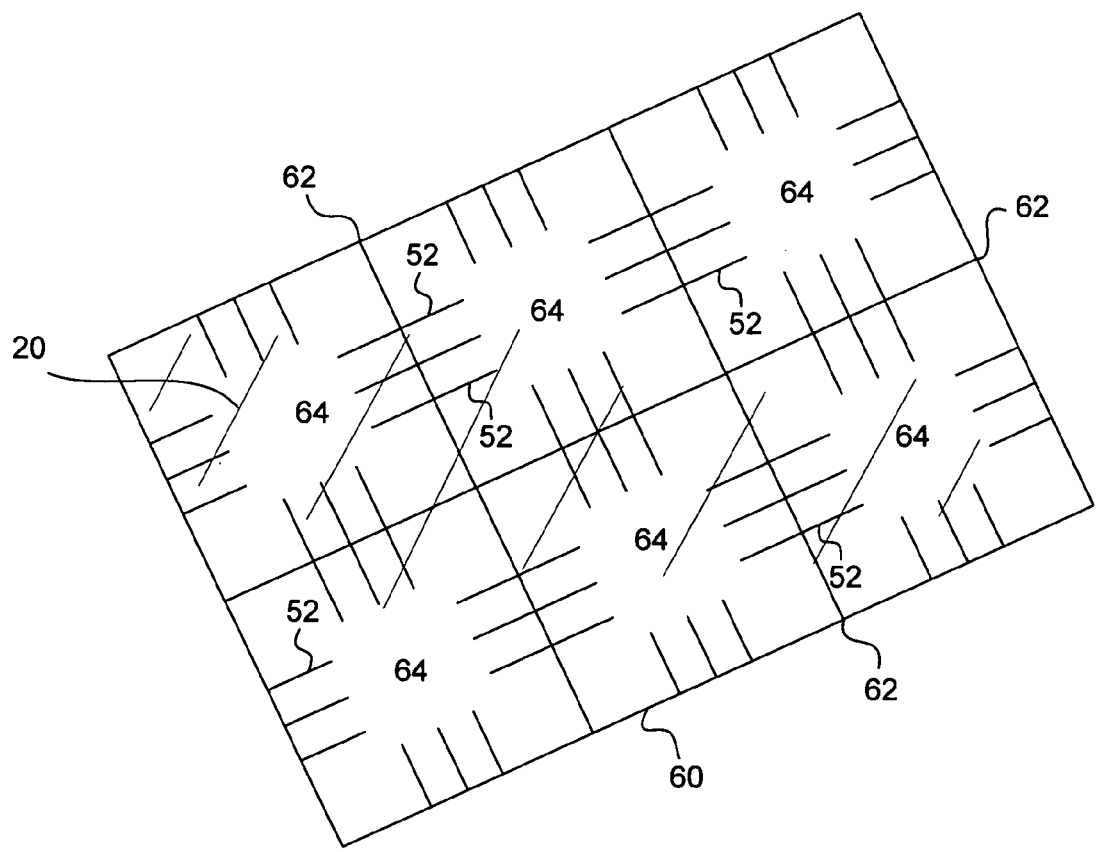
FIGS. 6A-6B are two perspective views of the manufacture of the semiconductor package of FIG. 5 according to the present invention.
Figure 6B:
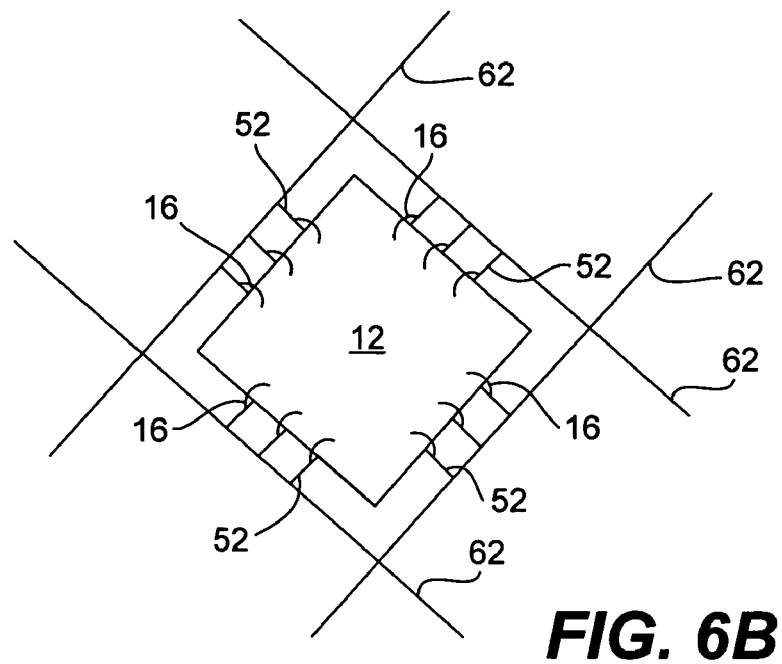

Referring to FIG. 6A, a leadframe 60 used for the chip on lead package 50 is shown. The leadframe 60 includes a plurality of tie-bars 62 which are used to hold the leads 52 for each package in place. The leads 52 are arranged to form a plurality of chip attach areas 64. The adhesive tape 20 is applied to the entire back surface of the leadframe 60 and is used to hold the leads 52 and the tie-bars 62 in place. During the packaging process, as illustrated in FIG. 6B, a chip 12 is secured to the leads 52 of an attach area 64. Although not visible in the figure, the adhesive tape 54 is used to secure the chip 12 to the leads 52 and the adhesive material, either an epoxy 22 or double-stick tape 32, is used to secure the chip 12 to the adhesive tape 20. Once the chip 12 is secured in place, it is encapsulated. For the sake of simplicity, only a single chip 12 and attach area 64 is shown. Typically though, chips 12 are placed on all the attach areas 64 and then the entire lead frame 60 is encapsulated. Thereafter, the lead frame 60 is cut along the tie-bars 64 to singulate each package.

Figure 7A:
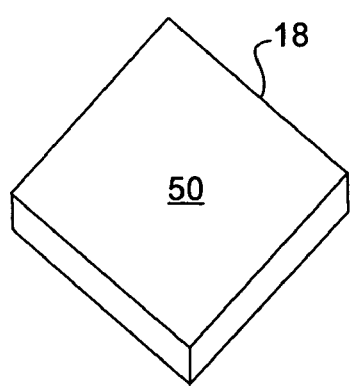
FIGS. 7A and 7B are perspective views of the package of FIG. 5 according to the present invention.
Figure 7B:
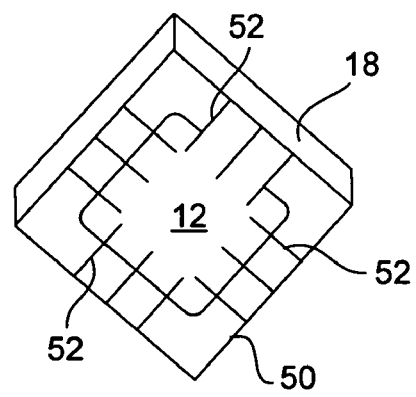

Referring to FIGS. 7A and 7B, top and bottom perspective views of the package 50 are shown after singulation. In FIG. 7A, the chip 12 is encapsulated. As a result, only the encapsulating material 18 is visible. In FIG. 7B, however, the bottom view of the package 50 reveals the chip 12 overlapping and positioned over the leads 52. The chip on lead package 50 thus provides several advantages. A chip or die attach pad is not required. Accordingly, the height of the package 50 is reduced. Similarly, with the die resting on the leads 52, the lateral dimensions or "footprint" of the package is also reduced. Finally, the use of an adhesive between the chip 12, the tape 20, and the leads 52 tends to significantly reduce the possibility of the chip 12 moving out of alignment during the encapsulation process.

Figure 8A:
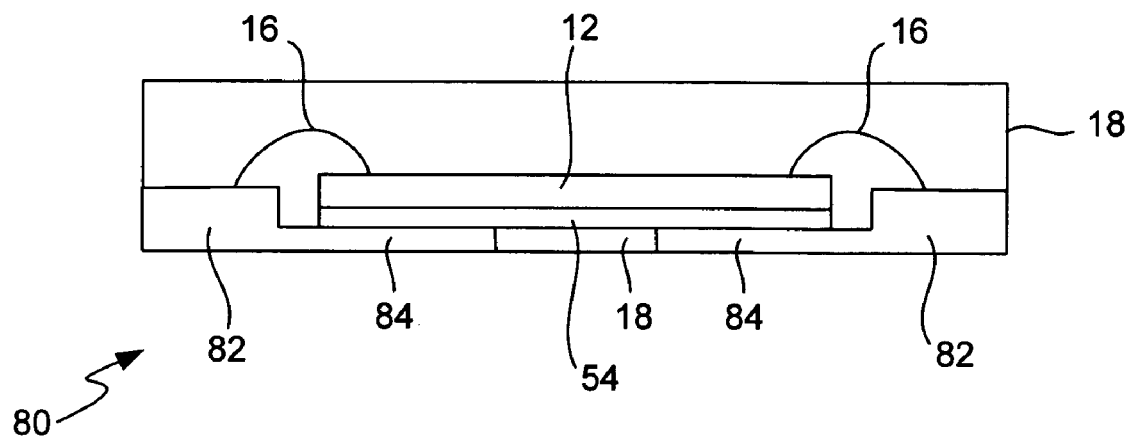
FIGS. 8A and 8B are cross section views of two different chip on lead packages according to the present invention.

Referring to FIG. 8A, cross sections of another chip on lead packages according to the present invention are shown. In FIG. 8A, the package 80 includes a chip 12 attached to the leads 82 of a lead frame using a die attach film 54. Wires bonds 16 are provided to electrically couple bond pads on the die 12 to the leads 82. The package 80 is encapsulated is encapsulated in an encapsulant material 18. The leads 82 are top etched to reduce the thickness or height of the leads 84 in the die attach area. As a result, the overall height of the package 80.

Figure 8B:
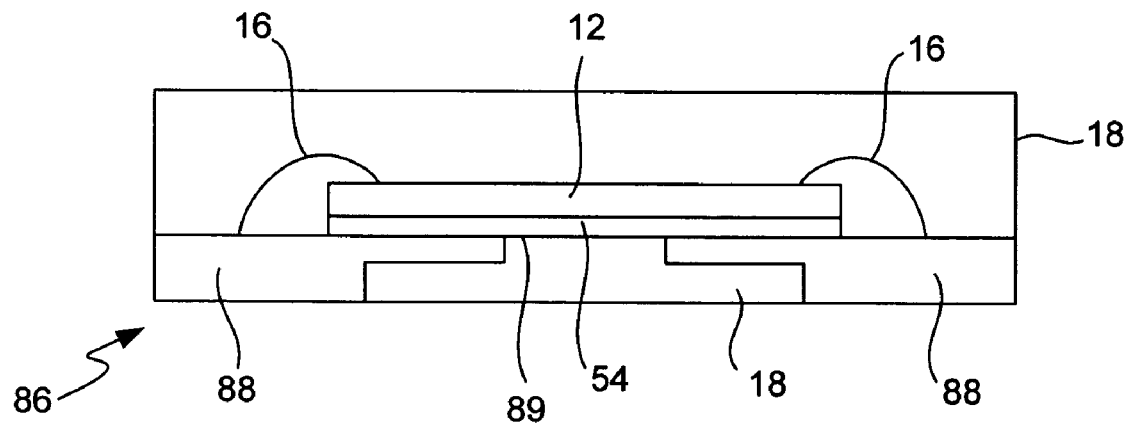

Referring to FIG. 8B, cross sections of yet another chip on lead packages according to the present invention are shown. In FIG. 8B, the package 86 includes a chip 12 attached to the leads 88 of a lead frame using a die attach film 54. Wires bonds 16 are provided to electrically couple bond pads on the die 12 to the leads 88. The package 86 is encapsulated in an encapsulant material 18. The leads 88 are bottom etched to create a gap region under the die 12. With this embodiment, the purpose of bottom etching is to reduce the length of the foot print of the leads 88. By defining the length of the leads from 0.4 to 0.6 millimeters in length, the package 86 is complaint with the Jedec MO-220 and MO-229 standards.

Figure 8C:
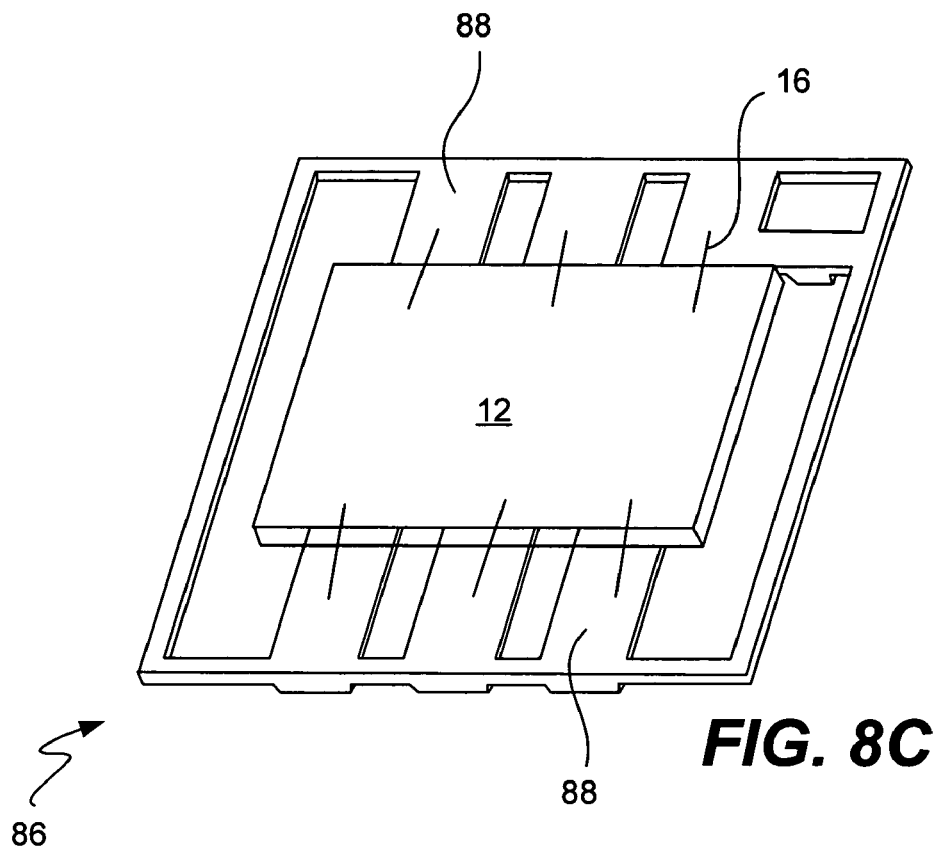
FIGS. 8C and 8D are top and bottom views of a chip on lead package prior to encapsulation.
Figure 8D:
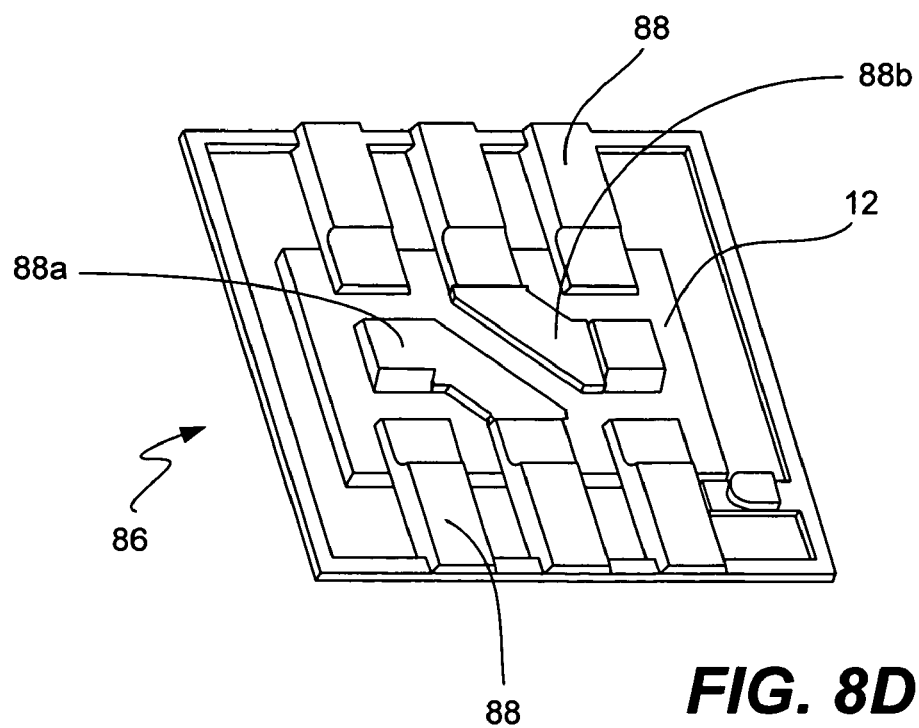

Referring to FIGS. 8C and 8D, top and bottom views of a chip on lead package prior to encapsulation are shown. FIG. 8C shows the die 12 resting on the leads 52. Wire bonds 16 are used to electrically connect the bond pads (not shown) on the die to the leads 52. In FIG. 8D, the die 12 is again shown positioned on the leads 52. To increase the surface area upon which the die 12 is positioned, one or more of the leads 52a and 52b are extended as shown. For the sake of simplicity, the die attach film 54 is not shown in FIGS. 8C and 8D.

It should be noted that with the embodiments of FIGS. 5, 8A and 8B, the die is attached to the leads or contacts of the package. In each example, wire bonds are used to electrically couple bond pads on the die to the lead contacts.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method for packaging a semiconductor chip, comprising:
    fabricating a semiconductor chip having an active surface and a non-active surface;
    applying an adhesive material in direct contact with the non-active surface of the chip;
    applying an adhesive tape over the adhesive material adjacent the non-active surface of the semiconductor chip so that the adhesive material is provided between the non-active surface and the adhesive tape; and
    positioning the semiconductor chip onto a plurality of contacts, each of the contacts having a first end of varying lengths relative to one another, such that the adhesive tape adjacent the non-active surface of the semiconductor chip is in contact with the plurality of contacts, the varying lengths of the plurality of contacts providing support surfaces for the semiconductor chip, whereby the plurality of contacts entirely support the semiconductor chip without the use of a die attach pad.

2. The method of claim 1, wherein applying the adhesive material further comprises applying a non-conductive epoxy.

3. The method of claim 1, wherein applying the adhesive material further comprises applying a conductive epoxy.

4. The method of claim 1, wherein applying the adhesive material further comprises applying a silver resin.

5. The method of claim 1, wherein applying the adhesive material further comprises applying a double-stick die adhesive film to the non-active surface of the semiconductor device.

6. The method of claim 1, wherein the contacts are leads.

7. The method of claim 1, further comprising etching a first surface of the leads.

8. The method of claim 7, further comprising a second surface of the leads.

9. The method of claim 1, further comprising forming electrical contacts between the plurality of contacts and the active surface of the semiconductor chip and encapsulating the semiconductor chip in an encapsulating material.

10. A method comprising:
    providing one or more leads, the one or more leads each having a first end of varying lengths with respect to one another;
    providing a semiconductor chip having an active surface and a non-active surface, the non-active surface of the semiconductor chip being supported by the varying lengths of the first ends of the one or more leads respectively;
    applying an adhesive material onto and in direct contact with the non-active surface of the semiconductor chip; and
    attaching an adhesive tape to the adhesive material, the adhesive tape acting to adhere the semiconductor chip onto the one or more leads, whereby the semiconductor chip is entirely supported on the one or more leads without a die attach pad.

11. The method of claim 10, wherein applying the adhesive material further comprises applying a non-conductive epoxy.

12. The method of claim 10, wherein applying the adhesive material further comprises applying a conductive epoxy.

13. The method of claim 10, wherein applying the adhesive material further comprises applying a silver resin.

14. The method of claim 10, wherein applying the adhesive material further comprises applying a double-stick die attach film.

15. The method of claim 10, further comprising etching a first surface of the leads.

16. The method of claim 15, further comprising etching a second surface of the leads.

17. The method of claim 10, further comprising forming electrical connections between the leads and contacts on the active surface of the semiconductor chip.

18. The method of claim 10, further comprising encapsulating the semiconductor chip and a portion of the leads so that the non-encapsulated portion of the leads are exposed.

* * * * *